United States Patent

Tuan

[11] Patent Number: 5,374,577
[45] Date of Patent: Dec. 20, 1994

[54] POLYSILICON UNDERCUT PROCESS FOR STACK DRAM

[75] Inventor: Hsiao-Chin Tuan, Hsinchu, Taiwan, Prov. of China

[73] Assignee: Industrial Technology Research Institute, Hsincho, Taiwan, Prov. of China

[21] Appl. No.: 993,625

[22] Filed: Dec. 21, 1992

[51] Int. Cl.$^5$ .................. H01L 21/70; H01L 27/00
[52] U.S. Cl. ........................ 437/52; 437/60; 437/919
[58] Field of Search .............. 437/47, 52, 60, 919

[56] References Cited

U.S. PATENT DOCUMENTS

| | | | |
|---|---|---|---|
| 4,977,102 | 12/1990 | Ema | 437/52 |
| 5,053,351 | 10/1991 | Fazan et al. | 437/52 |
| 5,071,783 | 12/1991 | Taguchi et al. | 437/52 |
| 5,155,056 | 10/1992 | Jeong-Gyoo | 437/47 |
| 5,155,657 | 10/1992 | Oehrlein et al. | 437/52 |
| 5,180,683 | 1/1993 | Wakamiya et al. | 437/47 |
| 5,212,916 | 6/1992 | Tseng | 361/313 |
| 5,215,930 | 6/1993 | Lee et al. | 437/40 |

Primary Examiner—Olik Chaudhuri
Assistant Examiner—H. Jey Tsai
Attorney, Agent, or Firm—George O. Saile

[57] ABSTRACT

A method for fabricating DRAM capacitors is described. Field effect devices are foraged in the silicon substrate. A first oxide layer is formed over the device and field oxide areas. The capacitors are formed by first depositing a heavily doped silicon layer over the device and field oxide areas. Then forming openings to the desired source/drain structures by etching through the silicon layer, and first oxide layers, wherein the opening extends over a portion of the gate electrode polysilicon layer of the gate structure and the field oxide areas. An undoped polysilicon layer is deposited over the openings to the source/drain structures. Patterning anisotropically the silicon and molysilicon layers so as to have their remaining portions over the planned capacitor areas, and wherein a portion of the heavily doped silicon layer remains over both the portion of the polysilicon gate electrode of the gate structure and the field oxide areas. Then completely removing by selective etching the portion of heavily doped silicon layer using phosphoric acid at a temperature greater than 140° C. to create an undercut of the undoped polysilicon layer over both the portion of the polysilicon gate electrode of the gate structure and the field oxide areas and to construct the bottom storage node electrode of the desired capacitor. The capacitor is then completed.

17 Claims, 4 Drawing Sheets

POLYSILICON UNDERCUT PROCESS FOR STACK DRAM

BACKGROUND OF THE INVENTION

1. Field of the Invention

This invention relates to the fabrication of integrated circuit devices and more particularly to a method of fabricating high density dynamic random access memory (DRAM) devices and the like, with particular emphasis upon the capacitor formation.

2. Description of the Prior Art

As DRAMs are scaled down in dimensions, there is a continuous challenge to maintain a sufficiently high stored charge per capacitor. In order to construct high density DRAMs in a reasonable sized chip area, the cell structures have to change from the conventional planar-type capacitors to either trench capacitors or stack capacitors, in particular beyond the 1 Mbit DRAM era. All efforts to increase capacitance without increasing the planar area of the capacitor can be categorized into the following techniques:

(1) Thinning the capacitor dielectric and/or using films with a higher dielectric constant, such as oxide-nitride-oxide (ONO) films composite, nitride-oxide (NO) and more recently tantalum pentoxide which will require further development to overcome leakage and reliability problems. (2) Building three dimensional capacitor structures to increase the capacitor area without increasing the planar area of the capacitor. There are two major branches of this approach, that is trench capacitors and stacked capacitors. In the category of trench capacitors, when the DRAM is beyond 16 Mbit, the trench needs to be very deep. There are technology and even theoretical physical limitations to processing the deep trenches that would be needed. When the stacked capacitor approach is used to fabricate 16 Mbit DRAMs and beyond, very complicated stacked structures are needed, such as fin structures, crown structures, and so forth. The making of such structures require complicated manufacturing processes which are costly and resultt in reduced yield.

Most recently a new concept has been advance which calls for toughening the polycrystalline silicon surface of the capacitor electrode to increase the surface area.

SUMMARY OF THE INVENTION

A principal object of the invention is to provide an effective and very manufacturable method to fabricate a stacked capacitor device having an increased effective electrode surface area.

Another object of this invention is to provide an new method for producing a increased stacked surface on a silicon surface for use in highly dense capacitor structures using the difference in etching selectivity between heavily doped and undoped silicon.

The invention method begins by selectively forming relatively thick field oxide areas on the surface of a semiconductor substrate while leaving device areas for fabrication of field effect devices. A gate dielectric layer is formed on the substrate in the device areas. A relatively thick first layer of polysilicon is deposited on the field oxide areas and device areas. Portions of the first polysilicon layer are removed while leaving portions thereof for the gate structure in the device areas, and portions over the field oxide areas. Source/drain structures are formed within said device areas of the semiconductor substrate associated with the gate structures. A first oxide layer is formed over the device and field oxide areas. The capacitors are formed by first depositing a heavily doped second silicon layer over the device and field oxide areas. Then forming openings to the desired source/drain structures by etching through the second silicon, and first oxide layers, wherein the opening extends over a portion of the first polysilicon layer of the gate structure and the field oxide areas. An undoped third polysilicon layer is deposited over the openings to the source/drain structures. Patterning anisotropically the second silicon and third polysilicon layers so as to have their remaining portions over the planned capacitor areas, and wherein a portion of the heavily doped second silicon layer remains over both the portion of the first polysilicon layer of the gate structure and the field oxide areas. Then removing by selective etching the portion of heavily doped second silicon layer to create an undercut of the undoped third polysilicon layer over both the portion of the first polysilicon layer of the gate structure and the field oxide areas and to construct the bottom storage node electrode of the desired capacitor. The remaining portions of bottom storage node electrode is doped. A capacitor dielectric layer is formed over the third polysilicon layer, and a fourth polysilicon layer is deposited thereover as the top plate electrode. The fourth polysilicon layer and the dielectric layer are patterned to complete the capacitor.

BRIEF DESCRIPTION OF THE DRAWINGS

In the accompanying drawings forming a material part of this description, there is shown.

DESCRIPTION OF THE PREFERRED EMBODIMENTS

Figure 1:
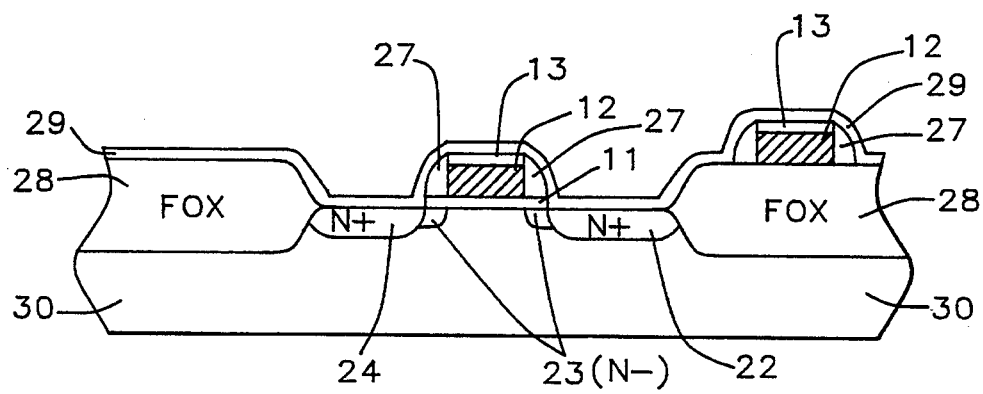
FIG. 1 through 7 schematically illustrate in cross-sectional representation one preferred method embodiment of this invention.

Referring now to FIG. 1, there is illustrated a partially completed DRAM structure upon which the new capacitor structure of the invention will be fabricated. The first series of steps involve the formation of the dielectric isolation regions for isolating semiconductor surface regions from other such regions in the semiconductor substrate 30. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 28. Then semiconductor devices can be provided in the silicon mesas according to the following processes.

The surface of the silicon substrate 30 is thermally oxidized to form the desired gate oxide 11 thickness.

The preferred thickness is between about 80 to 200 Angstroms. The first polysilicon layer 12 is blanket deposited by LPCVD (Low Pressure Chemical Vapor Deposition) method. The preferred thickness of the first polysilicon layer 12 is between about 1000 to 4000 Angstroms. The first polysilicon layer 12 is ion implanted with phosphorous or arsenic ions under the conditions 5 to 10 E 15 dosage per cm$^2$ and 20 to 60 Kev. or doped with phosphorus oxychloride at a temperature about 900° C. Silicon oxide 13 is formed on the surface using a chemical vapor deposition process. The layers 11, 12 and 13 are patterned by conventional lithography and anisotropic etching techniques as are conventional in the art to provide a desired pattern of gate electrodes for transistor 10 and structure on the FOX 28 surfaces or elsewhere as seen in FIG. 1.

The source/drain structure of the MOS FET 10 may now be formed by the following steps. The FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the ion implantations of N— dopants. Lithographic masks may be required to protect the areas not to be subjected to that particular N— ion implantation. The formation of the lithographic masks are done by conventional lithography and etching techniques. The N— lightly doped drain implantation 23 are done with, for example phosphorous P31 at a dose of between about 1 to 10 E 13 atoms/cm.$^2$ and with an energy of between about 30 to 80 Kev.

The dielectric spacer 27 is now to be formed followed by the completion of the lightly doped drain source/drain structures. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 27 is between about 1000 to 4000 Angstroms and preferably about 2500 Angstroms.

An anisotropic etching of this layer produces the dielectric spacer layer 27 on the sidewalls of the layer structures 11, 12, 13. The preferred anisotropic etching uses a conventional reactive ion etching ambient.

The N+ source/drain ion implantation uses Arsenic, As75 with a dose of between about 2 E 15 to 1 E 16 atoms/cm.$^2$ and energy of between about 20 to 100 Kev. to complete the source/drain regions 22 of the N channel lightly doped drain MOS FET integrated circuits device as seen in the FIG. 1.

A first thin silicon oxide, or the like masking layer 29 is formed upon the layer structure regions 11, 12, 13; the spacers 27 and the exposed monocrystalline silicon substrate regions. The conditions for forming this layer 29 are LPCVD deposition of TEOS or silane based CVD silicon oxide deposition at about 600° to 900° C. The preferred thickness of this dielectric layer is between about 500 to 2500 Angstroms and a preferred thickness of about 1500 Angstroms.

Figure 2:
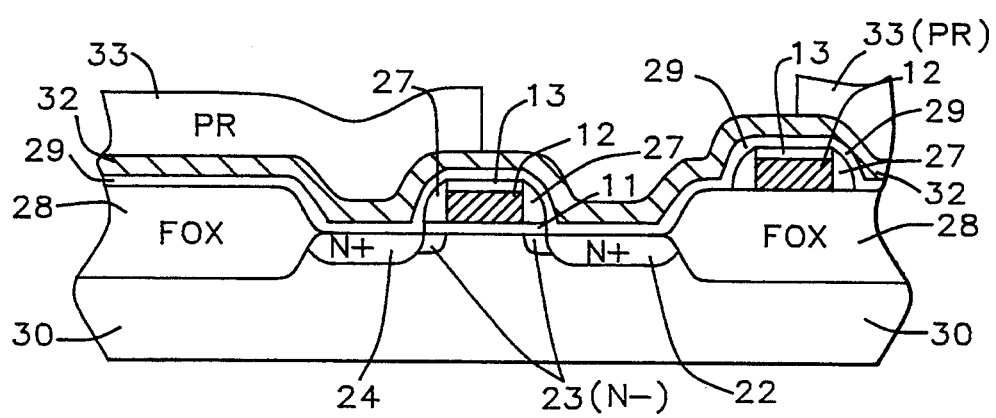

Referring now to FIGS. 2 though 6, the capacitor structure is fabricated by depositing a second heavily doped silicon layer 32 over the surface of silicon oxide layer 29 using the deposition techniques of Low Pressure Chemical Vapor Deposition (LPCVD). This layer may either be formed as amorphous or polycrystalline. Later heating at a temperature of less than about 900° C. to assure uniform distribution of the impurity, optimum grain size of the silicon which is polycrystalline after heating. The thickness of the second layer is typically between about 1500 to 5000 Angstroms. A conductivity imparting and differential etching imparting impurity is introduced into the first layer, either by ion implantation techniques or in situ doping. The impurity concentration in this first layer 32 must be greater than about 1 E 19 atoms per cm.$^3$ to allow differential etching between undoped polysilicon and this heavily doped layer. The impurity concentration may be as high as 1 E 21 atoms per cm$^3$. Phosphorus, arsenic and boron dopants are effective for the subsequent phosphoric acid solution etching process. It is this heavy doping concentration throughout that allows the success of the differential and selective etching process over the undoped polysilicon. The structure is heated to a temperature of less than about 900° C. to assure uniform distribution of the impurities, optimum grain size of between about 0.3 to 1.0 micrometers the silicon which is polycrystalline after the heating. Higher temperature heating causes a slower etching in phosphoric acid which results in less selectivity between doped and undoped polysilicon.

Figure 3:
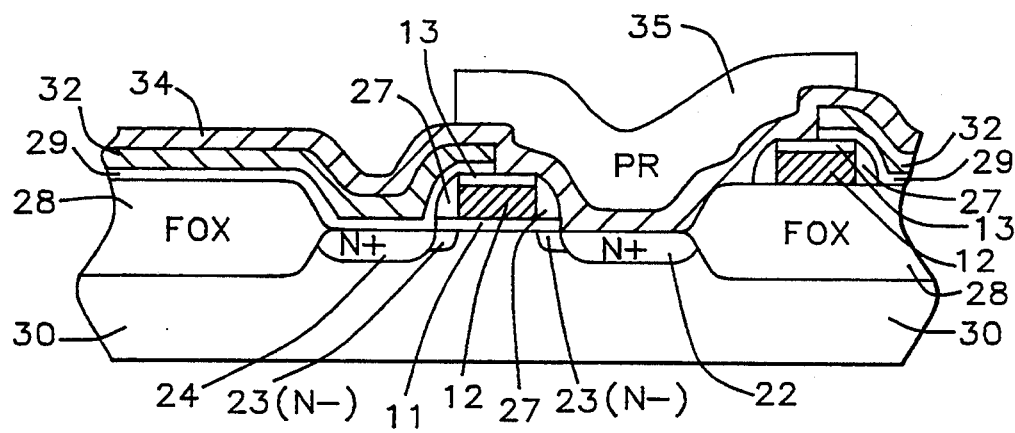

Openings are formed to the desired source/drain structures 22 by etching through the second silicon layer 32 and first silicon oxide layer 29 using a lithography mask, PR 33. The mask 33 is formed so as to have the opening extend over a portion of the first polysilicon layer 12 of the gate structure and the field oxide areas as seen in FIG. 2. Conventional anisotropic etching is used to etch these two layers 32 and 29. FIG. 3 shows the result of that etching process.

Figure 4:
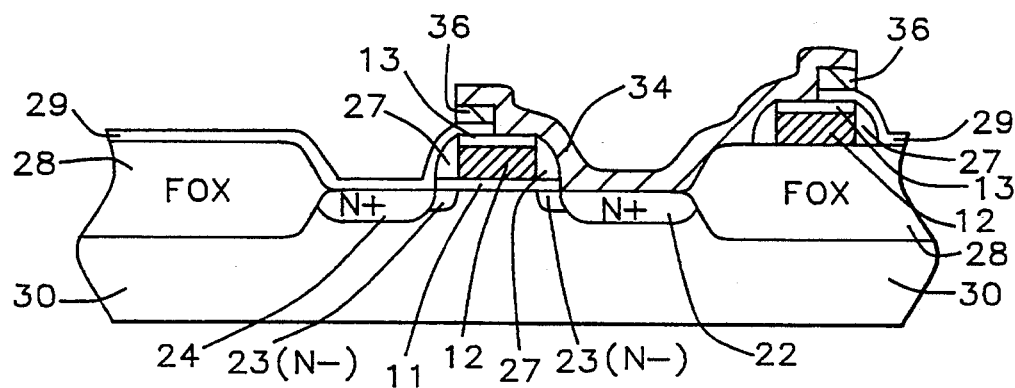

FIG. 3 shows the result of the deposition of the third silicon layer 34 which is typically polysilicon and is undoped. This layer will be the contact to the source/drain region 22. The layer is deposited by the LPCVD method and at a temperature within the range of about 600° to 620° C. The thickness of this layer 34 is between about 1000 to 2500 Angstroms. Another lithography mask PR 35 as seen in FIG. 3 is formed over the layer 34. The purpose of this mask 35 is to allow patterning anisotropically the second silicon layer 32 and third silicon layer 34 so as to have their remaining portions over the planned capacitor areas, and wherein a portion 36 of said heavily doped second silicon layer remains over both the portion of first polysilicon layer of the gate structure 11, 12, 13 and the field oxide 28 areas as seen in FIG. 4.

Figure 5:
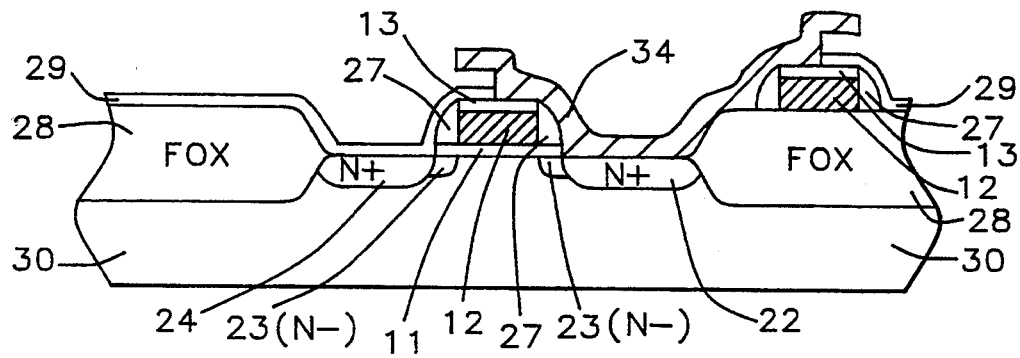

Referring now to FIG. 5 which shows the result of the selective etching of the heavily doped silicon layer 32 while leaving the undoped third silicon layer 34 in tact. This is the critical process of the capacitor formation. Phosphoric acid solution is preferably used to etch selectively the heavily doped layer 32 over the undoped layer 34. The layer 32 has been optimally prepared for the selective etching of it over the undoped layer 34 as described above. The etching is done using a phosphoric acid solution in water with a concentration of between about 85 to 87% by weight of phosphoric acid. The operative temperature of the etching process is between about 140 to 180 and preferably 155° to 165° C. for a time of more than about 60 minutes. The undercut shown in FIG. 5 will result in increased capacitance for the stacked capacitor of the invention. This completes the bottom node structure of the capacitor. The last step in this regard is to heavily dope this bottom node layer 34 by ion implantation with, for example phosphorus to a level of more than about 1 E 19 atoms/cm$^3$.

Figure 6:
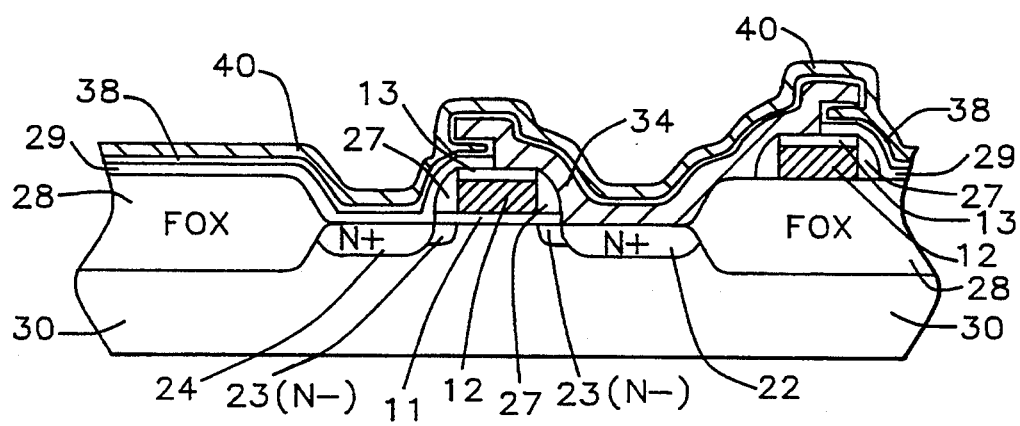

Referring now to FIG. 6, a thin dielectric layer 38 is deposited thereover. This layer serves as the capacitor dielectric. The thin dielectric or insulating layer has a thickness that is preferably in the range of about 30 to 250 Angstroms. The material of the dielectric layer can be of any suitable material having a high dielectric constant, and which forms a continuous, pinhole free layer. Preferably the dielectric layer is a composite layer of a silicon oxide-silicon nitride-silicon oxide with a total thickness of between about 40 to 150 Angstroms. Alternatively, and of particular importance for the future is the dielectric tantalum oxide, such as tantalum pentoxide or in combination with silicon dioxide and/or silicon nitride.

The preferred thickness of tantalum oxide or tantalum pentoxide is between about 150 Angstroms to 1000 Angstroms. The materials are of particular importance, because of their high dielectric constant.

As shown in FIG. 6, a fourth polycrystalline silicon layer 40 is deposited over layer 38 and patterned together with layer 38 to serve as the top plate electrode 40. The fourth polycrystalline silicon layer is also doped with an impurity, preferably with a concentration in the range of about $10^{19}$ to $10^{21}$ cm.$^3$.

Figure 7:
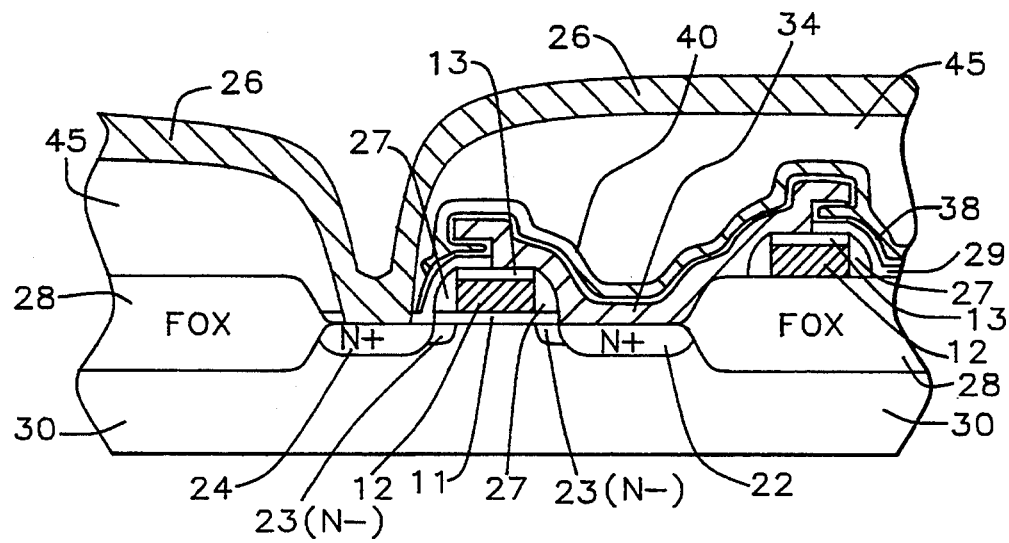

FIG. 7 shows the completion of the metal contacts to the monocrystalline silicon regions such as the bit line 26 contact to source regions 24. An insulating structure 45 may be composed of, for example a layer of silicon dioxide and a much thicker layer of borophosphosilicate glass, phosphosilicate glass or similar insulating layer. The operational thicknesses of these layers are between about 1000 to 2000 Angstroms for the oxide layer and between about 2000 to 10,000 or more Angstroms for the glasseous layer. These layers are typically deposited by chemical vapor deposition in low pressure or atmospheric pressure, or in a plasma enhanced reactive chamber.

The contact windows or openings are now formed through the insulating layered structure to the source regions 24 or the like in the device regions. The opening are not shown to the other regions, because they are outside of the cross-section of FIG. 7. This process step is conventionally done by lithography and etching techniques which preferably use a reactive ion etching process that will anisotropically etch both components of the insulating layer structure 45. A typical reactive ion etching process using fluorine containing etching chemical species. These oxide/glass layers etching processes are well known to those in the art. The size of the contact window opening can be as small as limitation of the etching and lithography patterning capability.

A bit line metal or composite metal layer or polycide composite layer (such as tungsten polycide) 26 is deposited over the exposed device region 24 and the insulating layer structure 45 both above and on the sides of the opening. This layer may be deposited by, for example chemical vapor deposition or sputtering. The operational thickness is between about 2000 to 10,000 Angstroms and the preferred thickness is between about 5000 to 7000 Angstroms. The thickness of this layer 26 is dependant upon the height and profile of the contact hole. This metal layer may be aluminum, aluminum-silicon, aluminum-silicon-copper, polycide, conductively doped polysilicon, tungsten or the like. Alternatively, a barrier metal layer (not shown) can be used under this metal layer.

Figure 8:
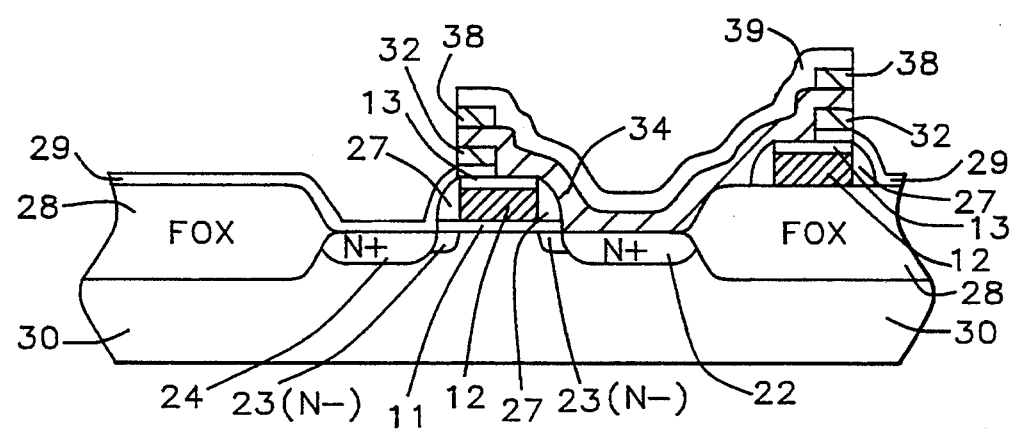
FIG. 8 schematically illustrate in cross-sectional representation a modification of the process shown in FIG. 1 through 7.

FIG. 8 shows a modification of the process of FIGS. 1 through 6 to even further increase the stacked capacitor capacitance using the undercut formation as described in the first process. As can be seen from the FIG. 8, two layers of heavily doped silicon 32, 38 and two layers of undoped polysilicon 34, 39 are used to create more than one undercut of the undoped polysilicon layer over both the portion of the first polysilicon layer of the gate structure 11, 12, 13 and the field oxide 28 areas and to construct the bottom storage node electrode of the desired capacitor. The heavily doped portions 32 and 38 are removed by selective etching as described in the FIGS. 1 through 7 process. The capacitor structure is thereafter formed as described above. Even more than two layers with undercuts can be formed in this way.

The following Examples are included to more fully understand the invention and are not intended to limited the invention thereto.

EXAMPLE I

A layer of undoped polysilicon was deposited by the CVD process as described above to a thickness of 3500 Angstroms at 620° C. on a silicon oxide layer covering a silicon wafer. The layer was doped using POCl$_3$ at a temperature of 950° C. for a time of 8 minutes in a diffusion furnace. The sample was cooled to room temperature. The wafer sample was then immersed into H$_3$PO$_4$ bath at a temperature of 160° C. for 90 minutes. The etching results recorded in TABLE I are average results from samples taken at 5 different locations on the wafer.

EXAMPLE II

A layer of polysilicon was (in-situ) doped with phosphorus during deposition, and deposited to a thickness of 1500 Angstroms at 675° C. on a silicon oxide layer covering a silicon wafer. The sample was cooled to room temperature. The wafer sample was then immersed into H$_3$PO$_4$ bath at a temperature of 160° C. for 100 minutes. The etching results recorded in TABLE I are average results from samples taken at 5 different locations on the wafer.

EXAMPLE III

A layer of undoped polysilicon was deposited to a thickness of 3500 Angstroms at 620° C. on a silicon oxide layer covering a silicon wafer. The sample was cooled to room temperature. The wafer sample was then immersed into H$_3$PO$_4$ bath at a temperature of 160° C. for 100 minutes. The etching results recorded in TABLE I are average results from samples taken at 5 different locations on the wafer.

EXAMPLE IV

A layer of undoped polysilicon was deposited to a thickness of 4500 Angstroms at 620° C. on a silicon oxide layer covering a silicon wafer. The sample was cooled to room temperature. The wafer sample was then immersed into H$_3$PO$_4$ bath at a temperature of 160° C. for 100 minutes. The etching results recorded in TABLE I are average results from samples taken at 5 different locations on the wafer.

TABLE I

| EXAMPLE | | thickness (Angstroms) | etching rate (Angstroms/hr) |
|---|---|---|---|
| I | before etch | 3258 | |
| | after etch | 2100 | |
| | etching loss | 1158 | |
| | Etching rate | | 772 |
| II | before etch | 1574 | |
| | after etch | 524 | |
| | etching loss | 1050 | |
| | Etching rate | | 630 |
| III | before etch | 4547 | |
| | after etch | 4529 | |
| | etching loss | 18 | |
| | Etching rate | | 11 |
| IV | before etch | 3658 | |
| | after etch | 3406 | |
| | etching loss | 252 | |
| | Etching rate | | 151 |

The results of the Examples I–IV show that phosphoric acid very effectively etches phosphorus oxychloride doped polysilicon and phosphorus in situ doped polysilicon. However, undoped polysilicon does not satisfactorily etch with phosphoric acid. Our conclusion is that phosphoric acid at about 160° C. can etch heavily phosphorus doped polysilicon. The etching rate is between about 600 to 800 Angstroms per minute.

EXAMPLES V–XII

Similar experiments have been performed for uniform and high dose doping with arsenic and boron using ion implantation sources of, respectively arsenic and boron difluoride. The results with doping levels of greater than about 1 E 19 atoms/cm$^3$, using phosphorus acid solution at 160 ° C. produced similar etching rates as with the phosphorus doping polysilicon Examples given above. The conditions and results of these Examples V–XII are shown in TABLE: Phosphoric Acid Etching Rate of Implanted Polysilicon as seen below.

TABLE

Phosphoric Acid Etching Rate of Implanted polysilicon

| Example | | thickness (Anstrong) | etching rate (Anstrong/hr) | Process Condition |
|---|---|---|---|---|
| V | before etch | 1925 | | As Imp, 80 KeV, 5E15/cm$^3$ |
| | after etching | 1311 | | 900 C Annealing, 30 min |
| | etching loss in 75 min | 614 | 491 | |
| VI | before etch | 1925 | | As Imp, 80 KeV, 5E15/cm$^3$ |
| | after etching | 280 | | No Annealing |
| | etching loss in 75 min | 1645 | 1316 | |
| VII | before etch | 1925 | | As Imp, 80 KeV, 1E16/cm$^3$ |
| | after etching | 1098 | | 900 C Annealing, 30 min |
| | etching loss in 75 min | 827 | 662 | |
| VIII | before etch | 1925 | | As Imp, 80 KeV, 1E16/cm$^3$ |
| | after etching | 274 | | No Annealing |
| | etching loss in 75 min | 1651 | 1321 | |
| IX | before etch | 1925 | | BF2 Imp, 60 KeV, 5E15/cm$^3$ |
| | after etching | 1507 | | 900 C Annealing, 30 min |
| | etching loss in 75 min | 418 | 334 | |
| X | before etch | 1925 | | BF2 Imp, 60 KeV, 5E15/cm$^3$ |
| | after etching | 733 | | No Annealing |
| | etching loss in 75 min | 1192 | 954 | |
| XI | before etch | 1925 | | BF2 Imp, 60 KeV, 1E16/cm$^3$ |
| | after etching | 1550 | | 900 C Annealing, 30 min |
| | etching loss in 75 min | 375 | 300 | |
| XII | before etch | 1925 | | BF2 Imp, 60 KeV, 1E16/cm$^3$ |
| | after etching | 916 | | No Annealing |
| | etching loss in 75 min | 1009 | 807 | |

While the invention has been particularly shown and described with reference to the preferred embodiments thereof, it will be understood by those skilled in the art that various changes in form and details may be made without departing from the spirit and scope of the invention.

What is claimed is:

1. A method for fabricating a dynamic random access memory having a capacitor comprising:

selectively forming field oxide areas on the surface of a semiconductor substrate while leaving device areas for fabrication of field effect devices;

forming a gate dielectric layer on said substrate in the said device areas;

depositing a first layer of polysilicon on the said field oxide areas and said device areas; removing portions of said first polysilicon layer while leaving portions thereof for the gate structure in said device areas, and portions over said field oxide areas;

forming source/drain structures within said device areas of said semiconductor substrate associated with said gate structures;

forming a first oxide layer over said device and field oxide areas; and forming said capacitors by, depositing a doped second silicon layer having a doping concentration greater than about 1 E 19 atoms/cm$^3$ over the device and field oxide areas, heating said second silicon layer to a temperature less than about 900° C. to form uniform grain size in said second silicon layer for subsequent selective etching while leaving said second silicon layer unoxidized, forming openings to said source/drain structures by etching through said second silicon, and first oxide layers, wherein said each opening extend over a portion of said first polysilicon layer of said gate structure and said field oxide areas, depositing an undoped third polysilicon layer over said openings to said source/drain structures and directly upon said doped second silicon layer, patterning anisotropically said second silicon and third polysilicon layers so as to have their remaining portions over capacitor areas, and wherein a portion of said doped second silicon layer remains over both the said portion of said first polysilicon layer of said gate structure and said field oxide areas, completely removing by said selective etching using phosphoric acid having a concentration greater than about 85% by weight and at a temperature greater than about 140° C. said portion of doped second silicon layer to create an undercut of said undoped third polysilicon layer over both the said portion of said first polysilicon layer of said gate structure and said field oxide areas and to construct the bottom storage node electrode of said desired capacitor, doping said remaining portions of said bottom storage node electrode, forming a capacitor dielectric layer over the said third polysilicon layer, and depositing a fourth polysilicon layer as the top plate electrode, and patterning said fourth polysilicon layer and said dielectric layer.

2. The method of claim 1 wherein the thickness of said first polysilicon layer is between about 1000 to 4000 Angstroms.

3. The method of claim 1 wherein the thickness of said second silicon layer is between about 1500 to 5000 Angstroms.

4. The method of claim 1 wherein the thickness of said third polysilicon layer is between about 1000 to 2500 Angstroms.

5. The method of claim 1 wherein said second silicon layer is deposited as amorphous silicon and the selectivity of etching the doped silicon layer versus the said undoped polysilicon layer is greater than about 10 to 50 wherein a phosphoric acid solution is used at a temperature of more than about 140° C.

6. The method of claim 5 wherein the said phosphoric acid solution has a concentration of about 85 to 87% phosphoric acid in water.

7. The method of claim 5 wherein said etching occurs at a temperature of between about 140° and 180° C.

8. The method of claim 1 wherein said doped second silicon layer is formed by low pressure chemical vapor deposition of silicon, ion implantation into said silicon and annealing said ion implanted silicon to make the silicon more uniformly polycrystalline, and to activate and distribute said ions through said second silicon layer.

9. The method of claim 1 wherein said second silicon layer is heated to assure uniform distribution of said impurity in the grain of said silicon which is polycrystalline after said heating.

10. The method of claim 9 wherein said second silicon layer is in situ doped with a phosphorus impurity in a concentration of between about 1 E 19 to 1 E 21 atoms/cm$^3$.

11. The method of claim 9 wherein said second silicon layer is deposited undoped and then doped by ion implantation with a phosphorus impurity in a concentration of between about 1 E 19 to 1 E 21 atoms/cm$^3$.

12. The method of claim 9 wherein said second silicon layer is deposited undoped and then doped by ion implantation with a arsenic impurity in a concentration of between about 1 E 19 to 1 E 21 atoms/cm$^3$.

13. The method of claim 9 wherein said second silicon layer is deposited undoped and then doped by ion implantation with a boron impurity in a concentration of between about 1 E 19 to 1 E 21 atoms/cm$^3$.

14. The method of claim 9 wherein said second silicon, layer is deposited as amorphous silicon and is transformed into polycrystalline silicon during said heating.

15. The method of claim 9 wherein said second silicon layer is deposited as polycrystalline silicon and is transformed into a more uniform and grain size during said heating.

16. The method of claim 9 wherein said heating is by furnace heating and is at a temperature off less than about 900° C. for more than about 25 minutes to adjust the grain size to between 0.3 to 1.0 micrometers.

17. The method of claim 1 wherein at least two layers of doped silicon and two layers of undoped polysilicon are used to create more than one said undercut of said undoped polysilicon layer over both the said portion of said first polysilicon layer of said gate structure and said field oxide areas and to construct the bottom storage node electrode of said capacitor.

* * * * *